United States Patent [19]

Miyata

[11] Patent Number: 5,491,358

[45] Date of Patent: Feb. 13, 1996

[54] SEMICONDUCTOR DEVICE HAVING AN ISOLATING PORTION BETWEEN TWO CIRCUIT REGIONS

[75] Inventor: Haruyuki Miyata, Yokohama, Japan

[73] Assignee: Kabushiki Kaisha Toshiba, Kawasaki, Japan

[21] Appl. No.: 479,830

[22] Filed: Jun. 7, 1995

Related U.S. Application Data

[63] Continuation of Ser. No. 271,650, Jul. 7, 1994, abandoned.

[30] Foreign Application Priority Data

Jul. 9, 1993 [JP] Japan ................................ 5-170058

[51] Int. Cl.[6] .............................................. H01L 29/784
[52] U.S. Cl. ........................ 257/546; 257/500; 257/528; 257/372; 257/355
[58] Field of Search .................................. 257/547, 546, 257/544, 390, 500, 534, 528, 368–372, 531, 355

[56] References Cited

U.S. PATENT DOCUMENTS 4,847,724  7/1989  Renous ................................... 257/546

5,065,212  11/1991  Ohata et al. ............................. 257/500
5,220,190   6/1993  Taguchi et al. .......................... 257/544
5,239,197   8/1993  Yamamoto ............................... 257/500
5,336,915   8/1994  Fujita et al. ............................. 257/369

FOREIGN PATENT DOCUMENTS 0319047  12/1988  European Pat. Off. ................ 257/369
62-58668  12/1982  Japan .
0310961  12/1990  Japan ..................................... 257/369
0234052  10/1991  Japan ..................................... 257/546

Primary Examiner—Robert P. Limanek
Assistant Examiner—Alexander Oscar Williams
Attorney, Agent, or Firm—Banner & Allegretti, Ltd.

[57] ABSTRACT

In a semiconductor device having a digital circuit region and an analog circuit region formed on an N type semiconductor substrate, a P type well region is formed on the semiconductor substrate and between the digital circuit region and the analog circuit region. Furthermore, an N type first diffusion layer is formed on the well region. In the semiconductor device, the isolating portion formed between the digital and analog circuit regions not only shuts off an electrical noise between the regions but also absorbs an electrostatic surge input from an external device to a power source terminal, thereby protecting the digital and analog circuit regions from electrostatic breakdown.

11 Claims, 7 Drawing Sheets

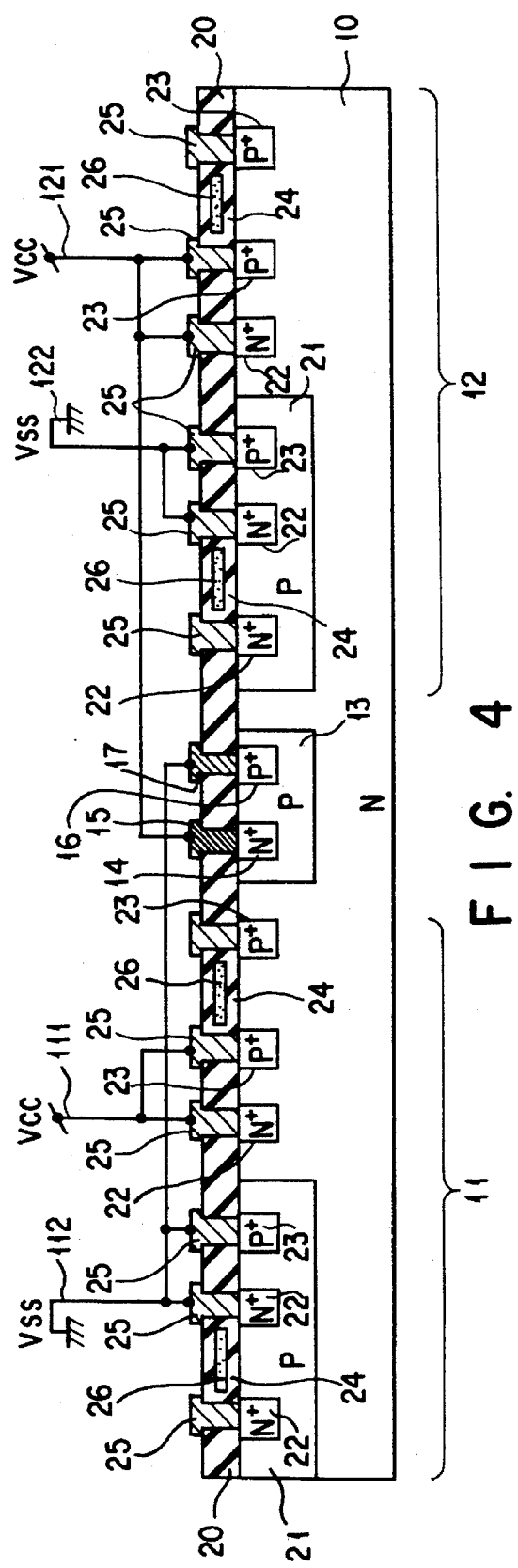
F I G. 4
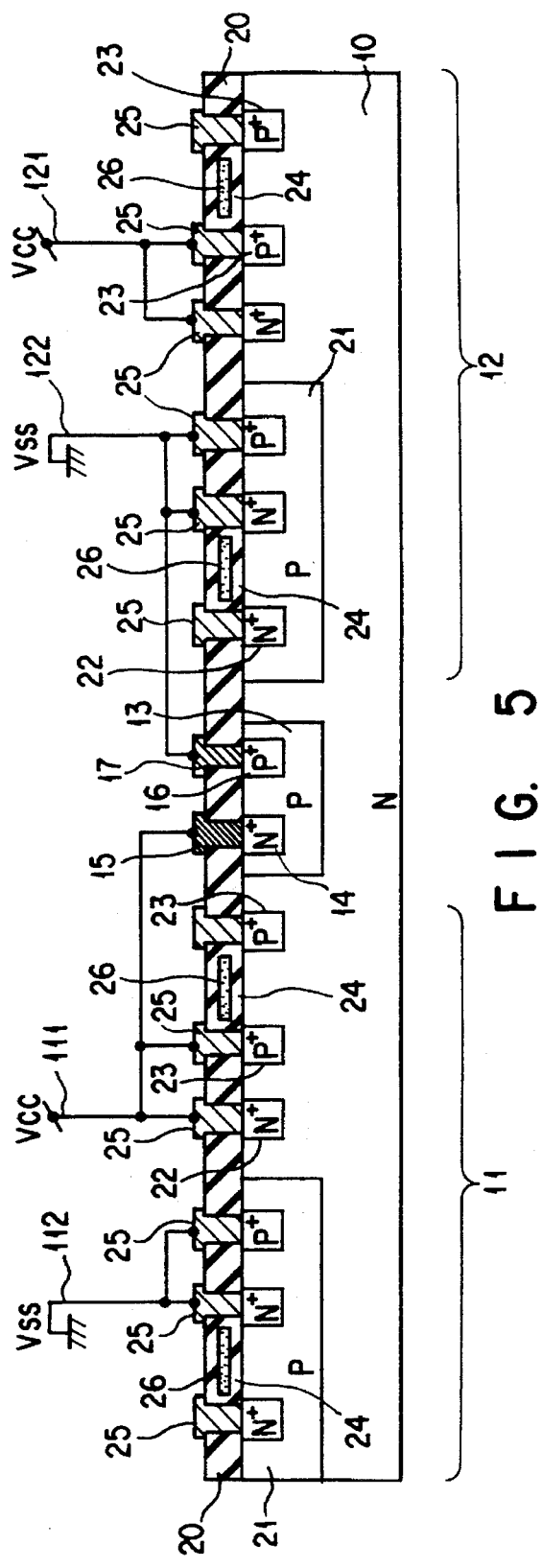
F I G. 5

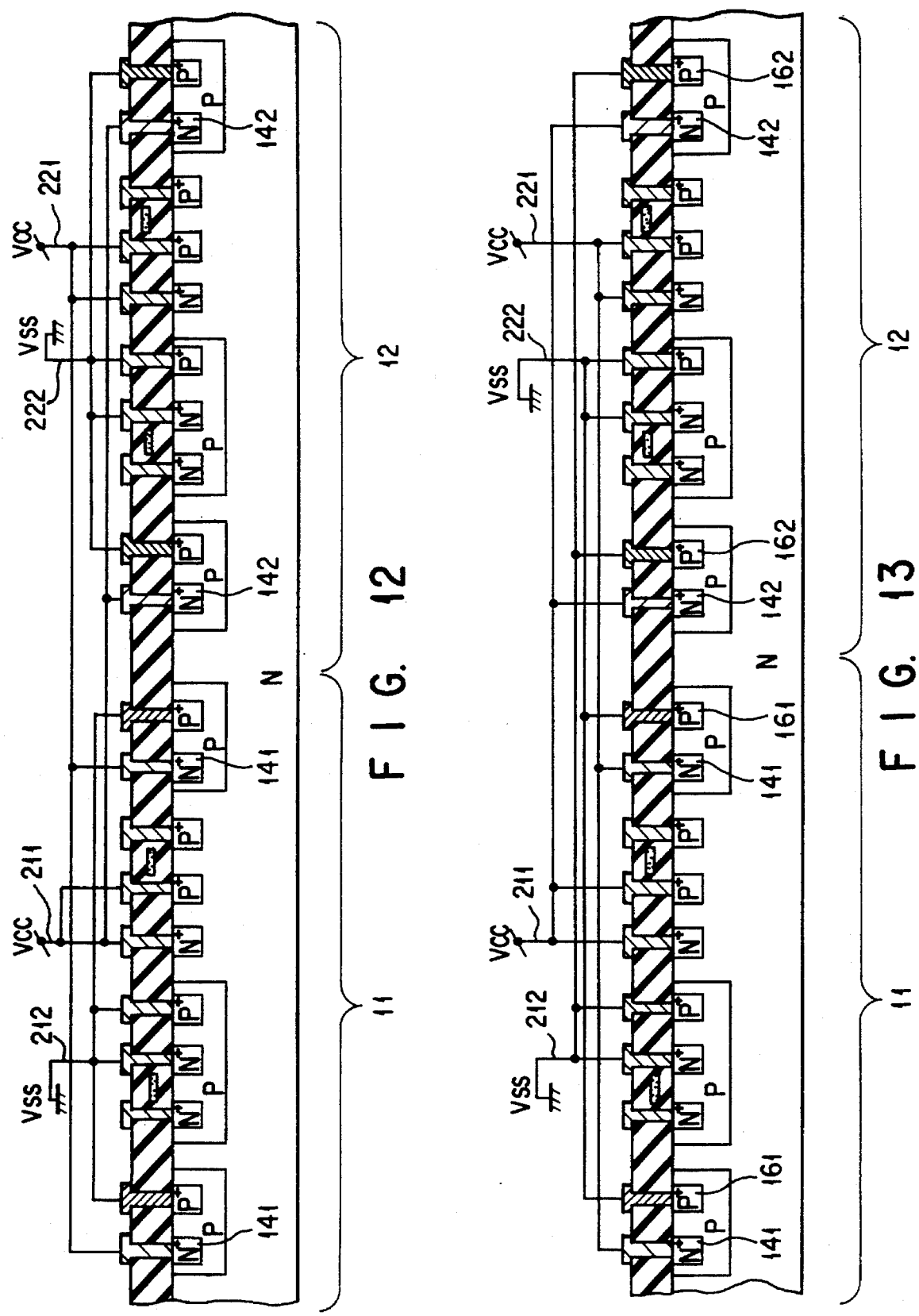

SEMICONDUCTOR DEVICE HAVING AN ISOLATING PORTION BETWEEN TWO CIRCUIT REGIONS

This is a continuation of application Ser. No. 08/271,650, filed Jul. 7, 1994, now abandoned.

BACKGROUND OF THE INVENTION

1. Field of the Invention

The present invention relates to a semiconductor device, and more particularly to an improvement of an isolating portion, formed between a digital circuit region and an analog circuit region of a semiconductor integrated circuit, for preventing adverse effect such as an electrostatic surge or electrical noise.

2. Description of the Related Art

Conventionally, it is known that, in a semiconductor device including a digital circuit region and an analog circuit region, an isolating portion is formed between these regions to cut off an electrical noise, so that an electrical noise generated in the digital circuit region may not adversely affect the analog circuit region.

For example, Jpn. Pat. Appln. KOKOKU Publication No. 62-58668 entitled "C-NOS Integrated Circuit and Method of Using the Same" discloses a C-NOS (complementary insulating gate type) integrated circuit having a digital circuit region 51 and an analog circuit region 52 formed on an N type semiconductor substrate 50, as shown in FIG. 1. In this circuit, an isolating portion 56, including a P type well 53, a $P^+$ type diffusion layer 54 formed on the P type well 53, and an electrode 55 in contact with the $P^+$ type diffusion layer 54, is formed between the digital and analog circuit regions. The lowest potential of the used potentials is applied to the electrode 55, thereby shutting off both circuit regions from an electrical noise.

In the digital and analog circuit regions 51 and 52, a reference numeral 61 denotes a P type well, 62 an $N^+$ type diffusion layer, 63 a $P^+$ type diffusion layer, 64 a gate oxide film formed on a substrate surface, 65 an electrode in contact with the $N^+$ type diffusion layer 62 or the $P^+$ type diffusion layer 63, and 66 a gate 10 electrode for use in a MOS transistor formed on the gate oxide film 64.

FIG. 2 shows another example of a conventional isolating portion of an integrated circuit. In this circuit, a digital circuit region 51 and an analog circuit region 52 are individually surrounded by P type wells 67. $P^+$ type diffusion layers 68 are respectively formed on the P type wells 67 and electrodes (not shown) are formed in contact with the $P^+$ type diffusion layers 68. That portion of a semiconductor substrate 50 interposed between the circuit regions 51 and 52 forms an isolating portion 56. With this constitution, both circuit regions are shut off from an electrical noise.

Assume that an electrostatic surge input to a power source terminal (not shown) from an external device is input either the digital circuit region 51 or the analog circuit region 52 through a power source line (not shown). The electrostatic surge flows through the substrate 50. Since the conventional isolating portion 56 does not shut off the digital and analog circuit regions from an electrostatic surge, it cannot protect the circuit regions from electrostatic breakdown.

As described above, in the semiconductor device having the digital circuit region and the analog circuit region, the conventional isolating portion formed between the two circuit regions is disadvantageous in that it cannot shut off an electrostatic surge input from an external device to the power source terminal and cannot protect the circuit regions from electrostatic breakdown.

SUMMARY OF THE INVENTION

The present invention has been made to overcome the above disadvantages of the conventional art. It is accordingly an object of the present invention to provide a semiconductor device in which an isolating portion formed between digital and analog circuit regions not only shuts off an electrical noise between the regions but also absorbs an electrostatic surge input from an external device to a power source terminal, thereby protecting the digital and analog circuit regions from electrostatic breakdown.

According to a first aspect of the present invention, there is provided a semiconductor device comprising:

a digital circuit region and an analog circuit region formed on a semiconductor substrate of a first conductivity type;

a well region of a second conductivity type opposite to the first conductivity type, formed on the semiconductor substrate and between the digital circuit region and the analog circuit region;

a first diffusion layer of the first conductivity type, formed on the well region;

a first electrode formed in contact with the first diffusion layer;

a second diffusion layer of the second conductivity type, formed on the well region; and a second electrode formed in contact with the second diffusion layer.

According to a second aspect of the present invention, there is provided a semiconductor device comprising:

a digital circuit region and an analog circuit region formed on a semiconductor substrate of a first conductivity type;

well regions of a second conductivity type opposite to the first conductivity type, formed on the semiconductor substrate and individually surrounding the digital circuit region and the analog circuit region;

first diffusion layers of the first conductivity type, formed on the well regions, individually surrounding the digital circuit region and the analog circuit region;

first electrodes formed in contact with the first diffusion layers;

second diffusion layers of the second conductivity type, formed on the well regions; and second electrodes formed in contact with the second diffusion layers.

In the semiconductor device according to the first aspect of the present invention, since the well region of the conductivity type opposite to that of the substrate is formed between the digital and analog circuit regions, it shuts off an electrical noise which passes through a surface region of the substrate between the two circuit regions.

Further, since a diode having a PN junction between the well region and the first diffusion layer is formed between the digital and analog circuit regions, if a voltage is applied to the first and second electrodes so that the PN junction is reverse-biased, even if an electrostatic surge, input from an external device to a power source terminal, flows through a substrate region between the two circuit regions, it is possible that the diode absorb the surge and both circuit regions are protected from electrostatic breakdown.

In the semiconductor device according to the second aspect of the present invention, since the well regions are formed so as to individually surround the digital and analog circuit regions, they shut off an electrical noise which passes through a surface region of the substrate.

Further, since a diode having a PN junction between the well region and the first diffusion layer is formed so as to surround the digital and analog circuit regions, if a voltage is applied to the first and second electrodes so that the PN junction is reverse-biased, even if an electrostatic surge, input from an external device to a power source terminal, flows through a substrate region between the two circuit regions, it is possible the diode absorb the surge and both circuit regions are protected from electrostatic breakdown.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is a cross-sectional view of the semiconductor device shown in FIG. 3, taken along the line IV—IV, showing the structure of the device in detail;

FIG. 5 is a cross-sectional view of a modification of the semiconductor device shown in FIG. 4, in which the power system for applying a biasing voltage to the diode shown in FIG. 4 is modified;

FIG. 12 is a cross-sectional view of still another modification of the semiconductor device shown in FIG. 9, in which the power system for applying a biasing voltage to the diode shown in FIG. 9 is modified; and FIG. 13 is a cross-sectional view of still another modification of the semiconductor device shown in FIG. 9, in which the power system for applying a biasing voltage to the diode shown in FIG. 9 is modified.

DETAILED DESCRIPTION OF THE PREFERRED EMBODIMENTS

Embodiments of the present invention will be described in detail with reference to the accompanying drawings.

Figure 1:
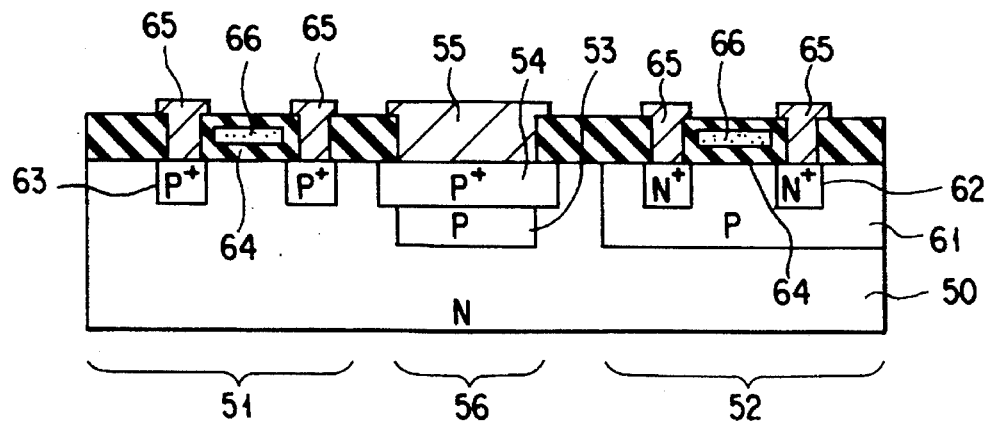
FIG. 1 is a cross-sectional view of a conventional semiconductor device.
Figure 2:
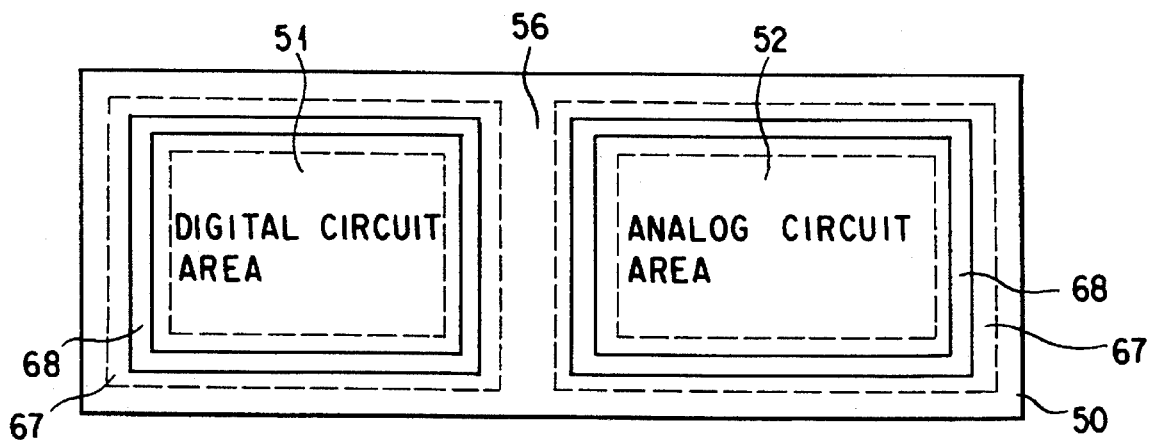
FIG. 2 is a schematic plan view of another conventional semiconductor device.
Figure 3:
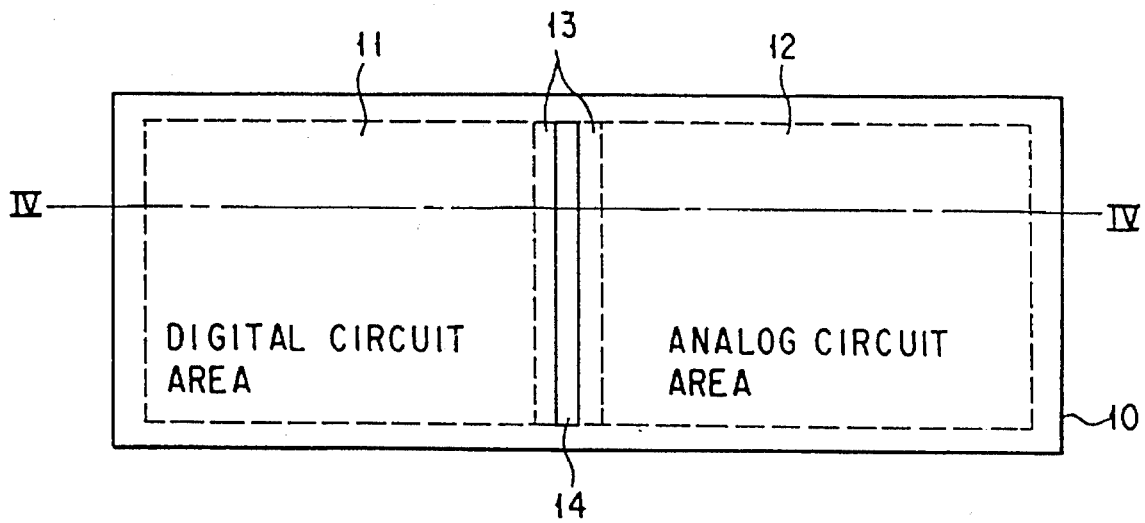
FIG. 3 is a schematic plan view of a semiconductor device according to a first embodiment of the present invention.

FIG. 3 is a schematic plan view of a CMOS integrated circuit according to a first embodiment of the present invention.

FIG. 4 is a cross-sectional view taken along the line IV—IV in FIG. 3, showing the detailed structure of the circuit shown in FIG. 3.

In FIGS. 3 and 4, a reference numeral 10 denotes a semiconductor substrate of a first conductivity type (N type in this embodiment), and reference numerals 11 and 12 are digital and analog circuit regions formed on the semiconductor substrate 10. A reference numeral 13 is a well region of a second conductivity type (P type in this embodiment) opposite to the first conductivity type, formed between the digital and analog circuit regions; 14 an $N^+$ type first diffusion layer formed on the P type well region 13; 15 a first electrode formed in contact with the $N^+$ type diffusion layer 14; 16 a $P^+$ type second diffusion layer formed on the P type well region 13; 17 a second electrode formed in contact with the $P^+$ type diffusion layer 16; and 20 an insulating film formed on a surface of the substrate.

In the digital and analog circuit regions 11 and 12, a reference numeral 21 denotes a P type well region, 22 an $N^+$ type diffusion layer, 23 a $P^+$ type diffusion layer, 24 a gate oxide film formed on the surface of the substrate, 25 an electrode brought into contact with the $N^+$ type diffusion layer 22 or the $P^+$ type diffusion layer 23, and 26 a gate electrode for use in a MOS transistor formed on the gate oxide film 24. In an actual manufacturing process, the $N^+$ type diffusion layer 22 and the $P^+$ type diffusion layer 23 are respectively formed in the same steps of forming the $N^+$ type diffusion layer 14 and the $P^+$ type diffusion layer 16.

In the above CMOS integrated circuit including the digital circuit region 11 and the analog circuit region 12, both a source potential ($V_{cc}$) and a ground potential ($V_{ss}$) are applied as operation power to the digital and analog circuit regions 11 and 12.

A power system of the digital circuit region 11 and a power system of the analog circuit region 12 are isolated from each other so as to influence each other as little as possible. For example, a $V_{cc}$ line 111 for the digital circuit region 11 and a $V_{cc}$ line 121 for the analog circuit region 12 branch off from the source terminal (not shown) of the CMOS integrated circuit, and a $V_{ss}$ line 112 for the digital circuit region 11 and a $V_{ss}$ line 122 for the analog circuit region 12 branch off from the ground terminal (not shown) of the CMOS integrated circuit. Since the power systems have the aforementioned branch structure, an influence of an electrical noise or electrostatic surge between the circuit regions is suppressed to a minimum.

A voltage is applied to the electrodes so that the PN junction between the P type well region 13 and $P^+$ type diffusion layer 16 on one hand and the $N^+$ type diffusion layer 14 is reverse-biased. In this embodiment, the P⁺ type diffusion layer 16 and the N⁺ type diffusion layer 14 are respectively connected to the $V_{ss}$ line 112 of the digital circuit region 11 and the $V_{cc}$ line 121 of the analog circuit region 12 via the electrodes 17 and 15, respectively.

In the above CMOS integrated circuit according to the first embodiment, the well region 13 of the conductivity type opposite to that of the semiconductor substrate 10 is formed between the digital and analog circuit regions 11 and 12, as in the conventional semiconductor device. Therefore, an electrical noise, which passes through a surface region of the substrate between the circuit regions 11 and 12, is cut off.

In addition, in the above CMOS integrated circuit of the first embodiment, a diode having the PN Junction between the P type well region 13 and the N⁺ type diffusion layer 14 is formed between the digital and analog circuit regions 11 and 12, and a voltage is applied to the first and second electrodes 15 and 17 so that the PN junction is reverse-biased. Therefore, even if an electrostatic surge input from an external device to the power source terminal passes through a substrate region between the circuit regions 11 and 12, it is possible that the aforementioned diode absorbs the surge and the digital and analog circuit regions 11 and 12 are protected from electrostatic breakdown.

For example, when a negative electrostatic surge is input from the outside of the integrated circuit to the power source terminal, the diode is forward-biased. As a result, the electrostatic surge is absorbed through the route consisting of the $V_{ss}$ line 112 of the digital circuit region 11, the diode and the $V_{cc}$ line 121 of the analog circuit region 12. When a positive electrostatic surge greater than $V_{cc}$ is input from the outside of the integrated circuit to the ground terminal, the diode is reverse-biased. As a result, the electrostatic surge is absorbed through the route consisting of the $V_{ss}$ line 112 of the digital circuit region 11, the diode and the $V_{cc}$ line 121 of the analog circuit region 12.

Therefore, even when an electrostatic surge is input as described above, there is no potential difference between the $V_{cc}$ line 111 and the $V_{ss}$ line 112 of the digital circuit 11 or between the $V_{cc}$ line 121 and the $V_{ss}$ line 122 of the analog circuit region 12.

Figure 6:
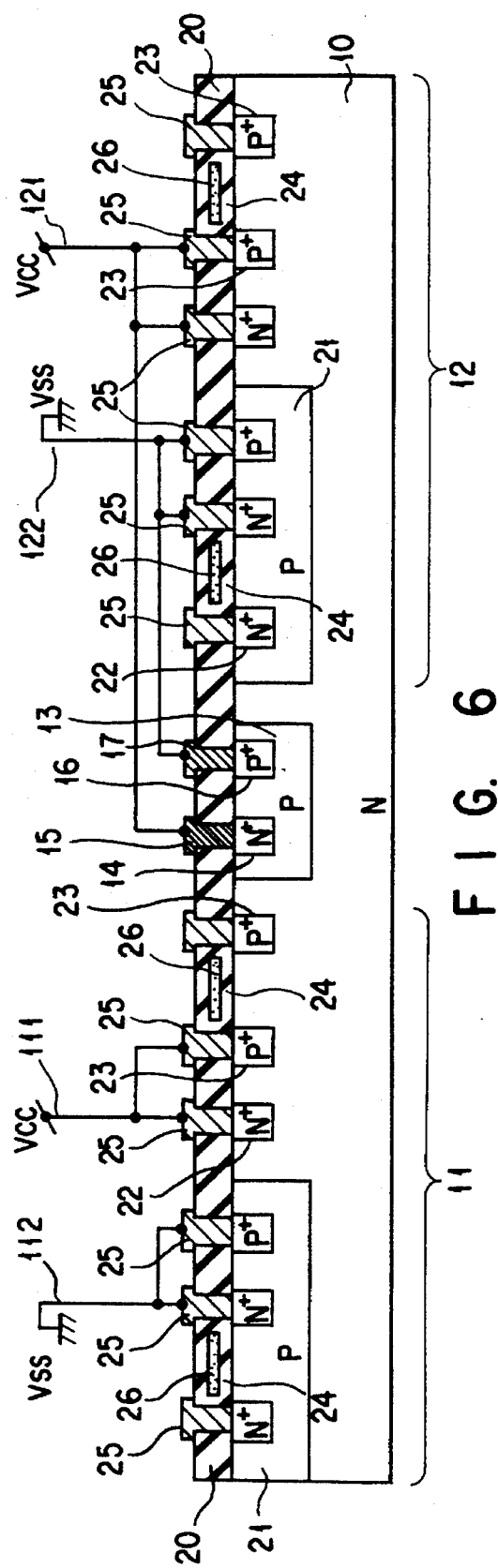
FIG. 6 is a cross-sectional view of another modification of the semiconductor device shown in FIG. 4, in which the power system for applying a biasing voltage to the diode shown in FIG. 4 is modified.
Figure 7:
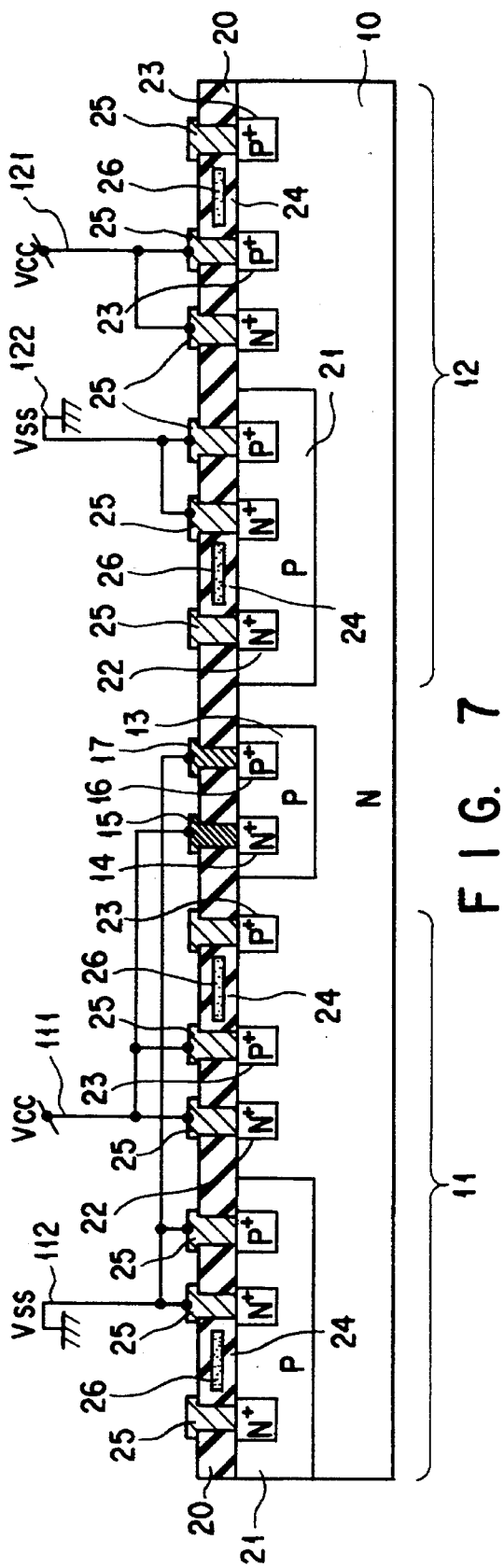
FIG. 7 is a cross-sectional view of still another modification of the semiconductor device shown in FIG. 4, in which the power system for applying a biasing voltage to the diode shown in FIG. 4 is modified.

FIGS. 5, 6 and 7 are cross-sectional views showing modifications of the power system for applying a biasing voltage to the diode shown in FIG. 4.

The CMOS integrated circuit shown in FIG. 5 is different from the CMOS integrated circuit shown in FIG. 4 in that the P⁺ type diffusion layer 16 and the N⁺ type diffusion layer 14 are respectively connected to the $V_{ss}$ line 122 of the analog circuit region 12 and the $V_{cc}$ line 111 of the digital circuit region 11. The other portions are the same as those shown in FIG. 4 and identified with the same reference numerals as used in FIG. 4.

The CMOS integrated circuit shown in FIG. 6 is different from the CMOS integrated circuit shown in FIG. 4 in that the P⁺ type diffusion layer 16 and the N⁺ type diffusion layer 14 are respectively connected to the $V_{ss}$ line 122 and the $V_{cc}$ line 121 of the analog circuit region 12. The other portions are the same as those shown in FIG. 4 and identified with the same reference numerals as used in FIG. 4.

The CMOS integrated circuit shown in FIG. 7 is different from the CMOS integrated circuit shown in FIG. 4 in that the P⁺ type diffusion layer 16 and the N⁺ type diffusion layer 14 are respectively connected to the $V_{ss}$ line 112 and the $V_{cc}$ line 111 of the digital circuit region 11. The other portions are the same as those shown in FIG. 4 and identified with the same reference numerals as used in FIG. 4.

The CMOS integrated circuits shown in FIGS. 5 to 7 operate in the same manner and provide the same effect as in the CMOS integrated circuit shown in FIG. 4.

Figure 8:
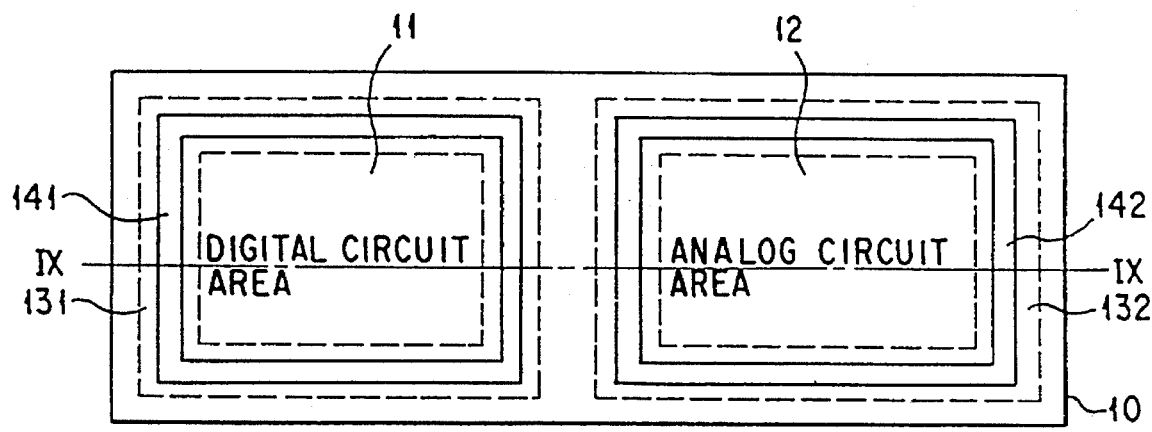
FIG. 8 is a schematic plan view of a semiconductor device according to a second embodiment of the present invention.

FIG. 8 is a schematic plan view showing a CMOS integrated circuit according to a second embodiment of the present invention.

The CMOS integrated circuit shown in FIG. 8 is different from the CMOS integrated circuit shown in FIG. 3 in that isolating portions individually surround the digital circuit region 11 and the analog circuit region 12. The other portions are the same as those shown in FIG. 3.

Figure 9:
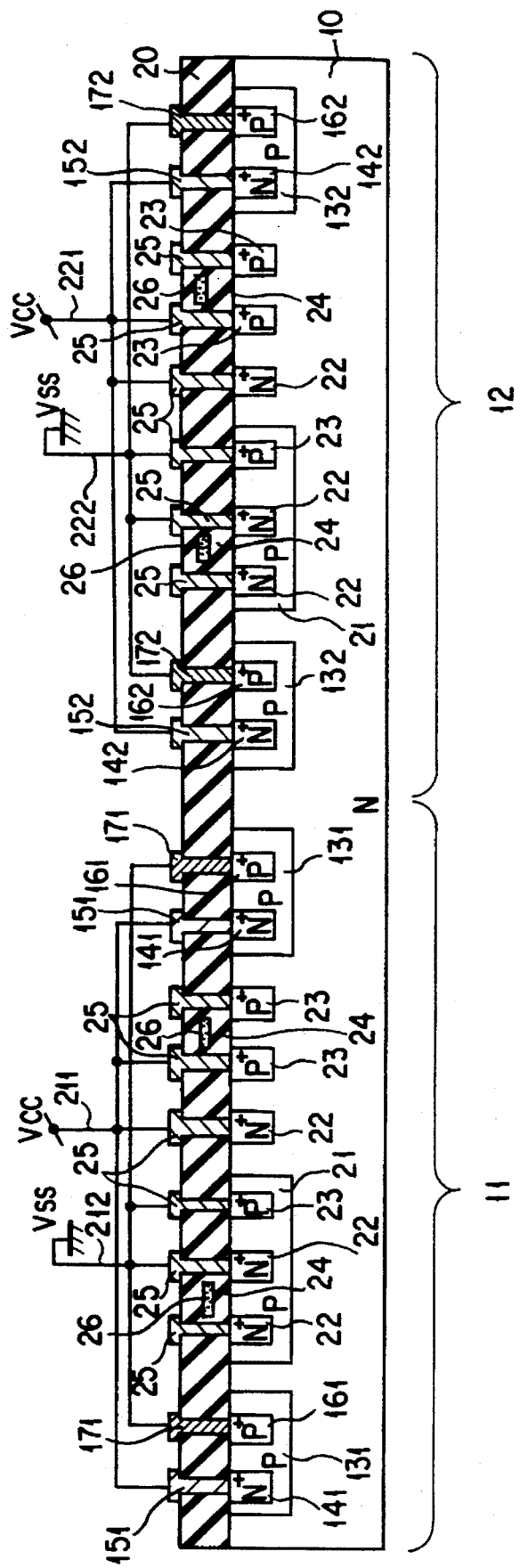
FIG. 9 is a cross-sectional view of the semiconductor device shown in FIG. 8, taken along the line IX—IX, showing the structure of the semiconductor device in detail.

FIG. 9 is a cross-sectional view taken along the line IX—IX in FIG. 8, showing the detailed structure of the circuit shown in FIG. 8.

In FIGS. 8 and 9, a reference numeral 10 denotes a semiconductor substrate of a first conductivity type (N type in this embodiment), and reference numerals 11 and 12 are digital and analog circuit regions formed on the semiconductor substrate 10.

A reference numeral 131 is a well region of a second conductivity type (P type in this embodiment) opposite to the first conductivity type, formed to surround the digital circuit region 11; 141 an N⁺ type first diffusion layer formed on the P type well region 131 to surround the digital circuit region; 151 a first electrode formed in contact with the N⁺ type diffusion layer 141; 161 a P⁺ type second diffusion layer formed on the P type well region 131 to surround the digital circuit region; 171 a second electrode formed in contact with the P⁺ type diffusion layer 161.

Likewise, a reference numeral 132 is a well region of a second conductivity type (P type in this embodiment) opposite to the first conductivity type, formed to surround the analog circuit region 12; 142 an N⁺ type first diffusion layer formed on the P type well region 132 to surround the analog circuit region; 152 a first electrode formed in contact with the N⁺ type diffusion layer 142; 162 a P⁺ type second diffusion layer formed on the P type well region 132 to surround the analog circuit region; 172 a second electrode formed in contact with the P⁺ type diffusion layer 162; and 20 an insulating film formed on a surface of the substrate.

In the digital and analog circuit regions 11 and 12, a reference numeral 21 denotes a P type well region, 22 an N⁺ type diffusion layer, 23 a P⁺ type diffusion layer, 24 a gate oxide film formed on the surface of the substrate, 25 an electrode brought into contact with the N⁺ type diffusion layer 22 or the P⁺ type diffusion layer 23, and 26 a gate electrode for use in a MOS transistor formed on the gate oxide film 24. In an actual manufacturing process, the N⁺ type diffusion layer 22 and the P⁺ type diffusion layer 23 are respectively formed in the same steps of forming the N⁺ type diffusion layers 141 and 142 the P⁺ type diffusion layers 161 and 162.

In the above CMOS integrated circuit including the digital circuit region 11 and the analog circuit region 12, both a source potential ($V_{cc}$) and a ground potential ($V_{ss}$) are applied as operation power to the digital and analog circuit regions 11 and 12.

A power system of the digital circuit region 11 and a power system of the analog circuit region 12 are isolated from each other so as to influence each other as little as possible. For example, a $V_{cc}$ line 211 for the digital circuit region 11 and a $V_{cc}$ line 221 for the analog circuit region 12 branch off from the source terminal (not shown) of the CMOS integrated circuit, and a $V_{ss}$ line 212 for the digital circuit region 11 and a $V_{ss}$ line 222 for the analog circuit region 12 branch off from the ground terminal (not shown)

of the CMOS integrated circuit. Since the power systems have the aforementioned branch structure, an influence of an electrical noise or electrostatic surge between the circuit regions is suppressed to a minimum.

A voltage is applied to the electrodes so that the PN junction between the P type well region 131 and P$^+$ type diffusion layer 161 on one hand and the N$^+$ type diffusion layer 141 is reverse-biased. In this embodiment, the P$^+$ type diffusion layer 161 and the N$^+$ type diffusion layer 141 are respectively connected to the V$_{ss}$ line 212 of the digital circuit region 11 and the V$_{cc}$ line 211 of the analog circuit region 12 via the electrodes 171 and 151, respectively.

Likewise, a voltage is applied to the electrodes so that the PN junction between the P type well region 132 and P$^+$ type diffusion layer 162 on one hand and the N$^+$ type diffusion layer 142 is reverse-biased. In this embodiment, the P$^+$ type diffusion layer 162 and the N$^+$ type diffusion layer 142 are respectively connected to the V$_{ss}$ line 222 of the analog circuit region 12 and the V$_{cc}$ line 221 of the analog circuit region 12 via the electrodes 172 and 152, respectively.

In the above CMOS integrated circuit according to the second embodiment, the well regions 131 and 132 of the conductivity type opposite to that of the semiconductor substrate 10 surround the digital and analog circuit regions 11 and 12, respectively, as in the conventional semiconductor device. Therefore, an electrical noise, which passes through a surface region of the substrate between the circuit regions 11 and 12, is cut off.

In addition, in the above CMOS integrated circuit of the second embodiment, a diode having the PN junction between the p type well region 131 and the N$^+$ type diffusion layer 141 and a diode having the PN Junction between the P type well region 132 and the N$^+$ type diffusion layer 142 are formed to surround the digital and analog circuit regions 11 and 12, respectively and a voltage is applied across the first and second electrodes 151 and 171 and 152 and 172 so that the PN junctions are reverse-biased. Therefore, even if an electrostatic surge inputted from an external device to the power source terminals passes through a substrate region between the circuit regions 11 and 12, it is possible that the aforementioned diodes absorb the surge and the digital and analog circuit regions 11 and 12 are protected from electrostatic breakdown.

For example, when a negative electrostatic surge is input from the outside of the integrated circuit to the power source terminal, the diode formed between the P type well region 131 and the N type first diffusion layer 141 is forward-biased. As a result, the electrostatic surge is absorbed through the route consisting of the V$_{ss}$ line 212 of the digital circuit region 11, the diode and the V$_{cc}$ line 211 of the digital circuit region 11.

Alternatively, when a negative electrostatic surge is input from the outside of the integrated circuit to the power source terminal, the diode between the P type well region 132 and the N type first diffusion layer 142 is forward-biased. As a result, the electrostatic surge is absorbed through the route consisting of the V$_{ss}$ line 222 of the analog circuit region 12, the diode and the V$_{cc}$ line 221 of the analog circuit region 12.

When, on the other hand, a positive electrostatic surge greater than V$_{cc}$ is input from the outside of the integrated circuit to the ground terminal, the diode formed between the P type well region 131 and the N type first diffusion layer 141 is reverse-biased. As a result, the electrostatic surge is absorbed through the route consisting of the V$_{ss}$ line 212 of the digital circuit region 11, the diode and the V$_{cc}$ line 211 of the digital circuit region 12. Alternatively, when a negative electrostatic surge is input from the outside of the integrated circuit to the power source terminal, the diode between the P type well region 132 and the N type first diffusion layer 142 is forward-biased. As a result, the electrostatic surge is absorbed through the route consisting of the V$_{ss}$ line 222 of the analog circuit region 12, the diode and the V$_{cc}$ line 221 of the analog circuit region 12.

Therefore, even when an electrostatic surge is input as described above, there is no potential difference between the V$_{cc}$ line 211 and the V$_{ss}$ line 212 of the digital circuit 11 or between the V$_{cc}$ line 221 and the V$_{ss}$ line 222 of the analog circuit region 12.

In addition, the diodes surrounding the digital circuit region 11 and the analog circuit region 12 have a large area. Therefore, a great surge absorbing capacity can be provided with a small increase in chip size.

FIGS. 10 to 13 are cross-sectional views showing modifications of the power system for applying a biasing voltage to the diode shown in FIG. 9.

Figure 10:
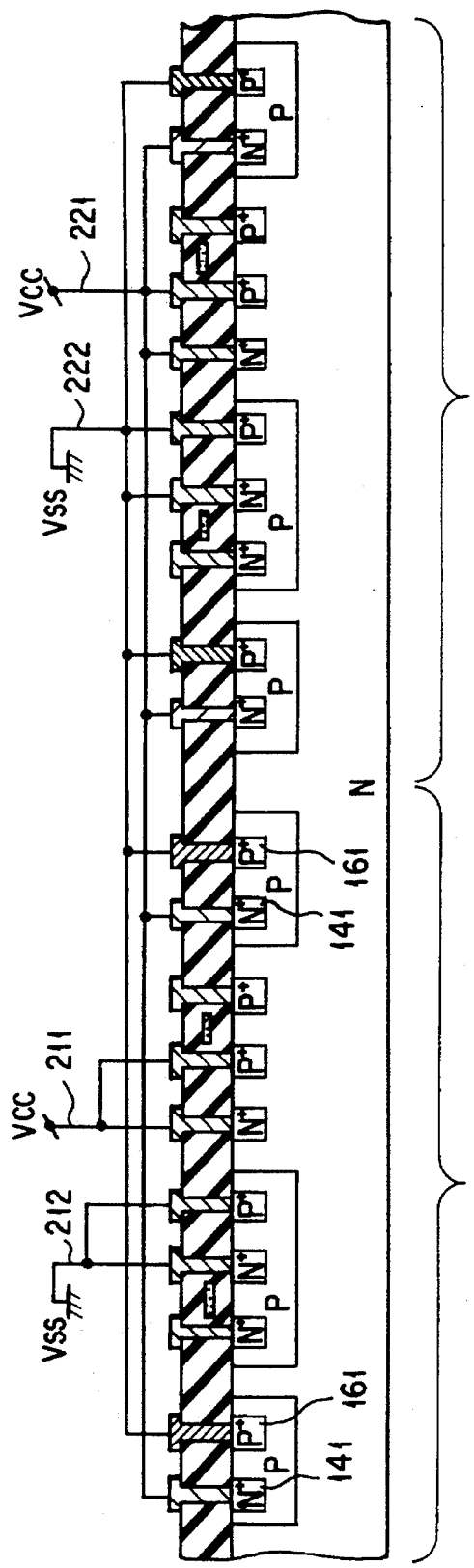
FIG. 10 is a cross-sectional view of a modification of the semiconductor device shown in FIG. 9, in which the power system for applying a biasing voltage to the diode shown in FIG. 9 is modified.

The CMOS integrated circuit shown in FIG. 10 is different from the CMOS integrated circuit shown in FIG. 9 in that the P$^+$ type diffusion layer 161 and the N$^+$ type diffusion layer 141 are respectively connected to the V$_{ss}$ line 222 of the analog circuit region 12 and the V$_{cc}$ line 221 of the analog circuit region 12. The other portions are the same as those shown in FIG. 10.

Figure 11:
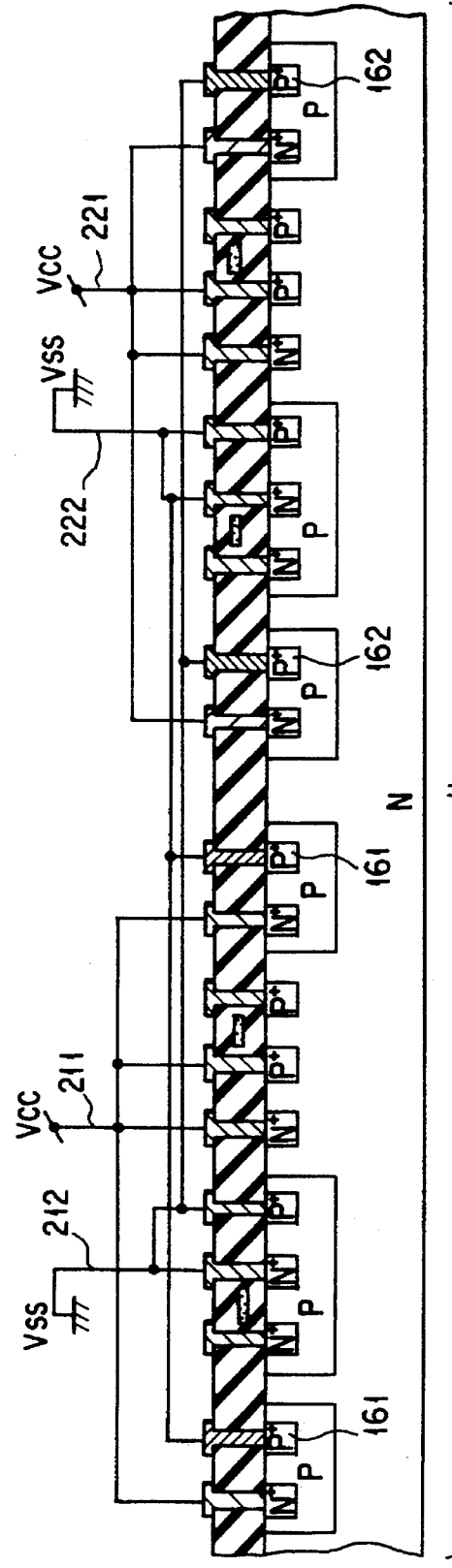
FIG. 11 is a cross-sectional view of another modification of the semiconductor device shown in FIG. 9, in which the power system for applying a biasing voltage to the diode shown in FIG. 9 is modified.

The CMOS integrated circuit shown in FIG. 11 is different from the CMOS integrated circuit shown in FIG. 9 in that the P$^+$ type diffusion layer 161 and the P$^+$ type diffusion layer 162 are respectively connected to the V$_{ss}$ line 222 of the analog circuit region 12 and the V$_{ss}$ line 212 of the digital circuit region 11. The other portions are the same as those shown in FIG. 9.

The CMOS integrated circuit shown in FIG. 12 is different from the CMOS integrated circuit shown in FIG. 9 in that the N$^+$ type diffusion layer 141 and the N$^+$ type diffusion layer 142 are respectively connected to the V$_{cc}$ line 221 of the analog circuit area 12 and the V$_{cc}$ line 211 of the digital circuit region 11. The other portions are the same as those shown in FIG. 9.

The CMOS integrated circuit shown in FIG. 13 is different from the CMOS integrated circuit shown in FIG. 9 in that the P$^+$ type diffusion layer 161 and the N$^+$ type diffusion layer 141 are respectively connected to the V$_{ss}$ line 222 and the V$_{cc}$ line 221 of the analog circuit region 12, and in that the P$^+$ type diffusion layer 162 and the N$^+$ type diffusion layer 142 are respectively connected to the V$_{ss}$ line 212 and the V$_{cc}$ line 211 of the digital circuit region 11. The other portions are the same as those shown in FIG. 9.

The CMOS integrated circuits shown in FIGS. 10 to 13 operate substantially in the same manner and provide substantially the same effect as in the CMOS integrated circuit shown in FIG. 9.

When a P type semiconductor substrate is used, the aforementioned P type well region, the P$^+$ type diffusion layer and the N$^+$ type diffusion layer are replaced with an N type well region, an N$^+$ type diffusion layer and a P$^+$ type diffusion layer, respectively, and a voltage is applied so that the PN junction between the P$^+$ type diffusion layer and the N type well region is reversebiased.

As has been described above, according to the semiconductor device of the present invention, the isolating portion formed between the digital and analog circuit regions or the insulating portions formed individually to surround the digital and analog circuit regions, not only shut off an electrical noise between the regions but also absorb an electrostatic surge input from an external device to a power source terminal, thereby protecting the digital and analog circuit regions from electrostatic breakdown.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:

a semiconductor substrate of a first conductivity type;

a first circuit region containing elements to form a digital circuit and a second circuit region containing elements to form an analog circuit, said first and second circuit regions formed on said semiconductor substrate;

a well region of a second conductivity type opposite to the first conductivity type, formed on said semiconductor substrate and between said first circuit region and said second circuit region;

a first diffusion layer of the first conductivity type, formed on said well region, said first diffusion layer and said well region constituting a passive element;

a first electrode formed in contact with said first diffusion layer;

a second diffusion layer of the second conductivity type, formed on said well region and spaced apart from said first diffusion layer; and a second electrode formed in contact with said second diffusion layer.

2. The semiconductor device according to claim 1, wherein:

a power source line of said first circuit region and a power source line of said second circuit region are separated from each other; and said first electrode is connected to one of the power source lines of said first circuit region and said second circuit region, and said second electrode is connected to the other of one of the power source lines of said first circuit region and said second circuit region, so that a junction between said well region and said first diffusion layer is reverse-biased.

3. The semiconductor device according to claim 1, wherein:

a power source line of said first circuit region and a power source line of said second circuit region are separated from each other; and said first electrode and said second electrode are respectively connected to said power source line and a grounded line of one of said first circuit region and said second circuit region, respectively.

4. A semiconductor device comprising:

a semiconductor substrate of a first conductivity type;

a first circuit region containing elements to form a digital circuit and a second circuit region containing elements to form an analog circuit, said first and second circuit regions formed on said semiconductor substrate;

a first well region of a second conductivity type opposite to the first conductivity type, formed on said semiconductor substrate and surrounding said first circuit region;

a first diffusion layer of the first conductivity type, formed on said first well region, said first diffusion layer and said first well region constituting a first passive element;

a first electrode formed in contact with said first diffusion layer;

a second diffusion layer of the second conductivity type, formed on said first well region and spaced apart from said first diffusion layer;

a second electrode formed on contact with said second diffusion layer;

a second well region of the second conductivity type opposite to the first conductivity type, formed on said semiconductor substrate and surrounding said second circuit region;

a third diffusion layer of the first conductivity type, formed on said second well region, said third diffusion layer and said well region constituting a second passive element;

a third electrode formed in contact with said third diffusion layer;

a fourth diffusion layer of the second conductivity type, formed on said second well region and spaced apart from said third diffusion layer; and a fourth electrode formed in contact with said fourth diffusion layer.

5. The semiconductor device according to claim 2 wherein one of said power source lines of said first circuit region and said second circuit region is a grounded line.

6. The semiconductor device according to claim 1, wherein said passive element comprises a diode.

7. The semiconductor device according to claim 4, wherein said first diffusion layer surrounds said first circuit region and said third diffusion layer surrounds said second circuit region.

8. The semiconductor device according to claim 4, wherein said first and second passive elements comprise diodes.

9. A semiconductor device comprising:

a semiconductor substrate of a first conductivity type;

a first circuit region containing elements to form a digital circuit and a second circuit region containing elements to form an analog circuit, said first and second circuit regions formed on said semiconductor substrate;

a well region of a second conductivity type opposite to the first conductivity type, formed on said semiconductor substrate and between said first circuit region and said second circuit region;

a first diffusion layer of the first conductivity type, formed on said well region;

a first electrode formed in contact with said first diffusion layer;

a second diffusion layer of the second conductivity type, formed on said well region and spaced apart from said first diffusion layer; and a second electrode formed in contact with said second diffusion layer, wherein a power source line of said first circuit region and a power source line of said second circuit region are separated from each other; and said first electrode is connected to one of the power source lines of said first circuit region and said second circuit region, and said second electrode is connected to the other one of the power source lines of said first circuit region and said second circuit region, so that a junction between said well region and said first diffusion layer is reverse-biased.

10. The semiconductor device according to claim 9, wherein one of said power source lines of said first circuit region and said second circuit region is a grounded line.

11. A semiconductor comprising:

a semiconductor substrate of a first conductivity type;

a first circuit region containing elements to form a digital circuit and a second circuit region containing elements to form an analog circuit, said first and second circuit regions formed on said semiconductor substrate;

a well region of a second conductivity type opposite to the first conductivity type, formed on said semiconductor substrate and between said first circuit region and said second circuit region;

a first diffusion layer of the first conductivity type, formed on said well region;

a first electrode formed in contact with said first diffusion layer;

a second diffusion layer of the second conductivity type, formed on said well region and spaced apart from said first diffusion layer; and a second electrode formed in contact with said second diffusion layer, wherein a power source line of said first circuit region and a power source line of said second circuit region are separated from each other; and said first electrode and said second electrode are respectively connected to said power source line and a grounded line of one of said first circuit region and said second circuit region, respectively.

* * * * *